United States Patent [19]

Maeda et al.

[11] Patent Number: 4,547,450

[45] Date of Patent: Oct. 15, 1985

[54] SILVER HALIDE SENSOR TYPE POLYMERIZABLE LIGHT-SENSITIVE MATERIAL

[75] Inventors: Minoru Maeda, Shizuoka; Masayuki Iwasaki, Kanagawa; Noriyuki Inoue; Mikio Totsuka, both of Shizuoka, all of Japan

[73] Assignee: Fuji Photo Film Company, Kanagawa, Japan

[21] Appl. No.: 457,602

[22] Filed: Jan. 13, 1983

[30] Foreign Application Priority Data

Jan. 13, 1982 [JP] Japan ................................... 57-3655

[51] Int. Cl.$^4$ ............................................. G03C 5/54
[52] U.S. Cl. .................................. 430/202; 430/204; 430/269
[58] Field of Search ............... 430/205, 264, 269, 949, 430/202, 281, 231, 232

[56] References Cited

U.S. PATENT DOCUMENTS

| | | | |
|---|---|---|---|
| 3,019,104 | 1/1962 | Oster | 430/264 X |
| 3,194,661 | 7/1965 | Cohen | 430/202 |
| 4,287,290 | 9/1981 | Mizuno et al. | 430/205 |

Primary Examiner—John E. Kittle
Assistant Examiner—Cynthia Hamilton

[57] ABSTRACT

A silver halide sensor type polymerizable light-sensitive material is disclosed. The material is comprised of a support having a silver halide photographic emulsion layer and a polymerizing layer adjacent to the emulsion layer. The polymerizing layer contains a nongaseous ethylenically unsaturated compound capable of undergoing addition polymerization upon reduction of the silver halide with a reducing compound. The material is capable of producing printing plates having good inking property and good printing durability. The material maintains the sensitivity and high resolving power of a silver halide photographic light-sensitive material.

19 Claims, No Drawings

SILVER HALIDE SENSOR TYPE POLYMERIZABLE LIGHT-SENSITIVE MATERIAL

FIELD OF THE INVENTION

The present invention relates to a process for forming polymeric images. More particularly, it relates to a process comprising selectively forming a polymeric compound on parts of a photographic material corresponding to photographic latent images using a silver halide photographic emulsion and a reducing agent. More specifically, the present invention relates to silver halide sensor type polymerizable light-sensitive material wherein a nongaseous ethylenically unsaturated compound capable of undergoing addition polymerization is polymerized simultaneously while carrying out a reduction reaction of silver halide in the presence of exposed silver halide. In addition, the present invention relates to multilayer silver halide sensor type polymerizable light-sensitive material which is characterized by containing a silver halide photographic emulsion and a nongaseous ethylenically unsaturated compound in different layers, respectively.

BACKGROUND OF THE INVENTION

The silver halide sensor type polymerizable light-sensitive material has been proposed, as described in Japanese Patent Publication No. 6581/71 and U.S. Pat. Nos. 3,697,275, 3,782,944, 3,756,818, 3,767,400, 3,782,943, 3,687,667, 3,874,947, 3,756,820, 3,790,378 and 3,746,542.

These patents only describe situations wherein the nongaseous ethylenically unsaturated compound is present in a processing solution or in the same layer as that of silver halide if it is present in the light-sensitive material. The patents contain no description about light-sensitive materials having a multilayer construction wherein the silver halide emulsion layer and the polymerizing layer containing a nongaseous ethylenically unsaturated compound are separated.

When the silver halide photographic emulsion and the nongaseous ethylenically unsaturated compound are present in the same layer, there are disadvantages. Since the silver halide photographic emulsion and the nongaseous ethylenically unsaturated compound are present in the same layer, the thickness of the polymerizing layer becomes large. Further, the resolving power is inferior, because it is necessary to swell the film in order to develop the silver halide. Since developed reduction silver is present, the intrinsic color of the coloring material cannot be obtained and, therefore, a desilvering step is required when dyeing or incorporating the coloring material in order to form visible polymer images. Further, since a hydrophilic binder must be mixed in order to disperse the silver halide which is hydrophilic, the inking property or printing durability is inferior when utilizing the formed polymer images as printing plates.

Further, when incorporating the coloring material, the coloring material functions as a filter when exposed to light, thus reducing sensitivity.

SUMMARY OF THE INVENTION

An object of the present invention is to aid in eliminating the above described disadvantages and provide silver halide sensor type light-sensitive materials having the essential sensitivity of silver halide and high resolving power.

Another object of the present invention is to provide silver halide sensor type light-sensitive materials which form visible images having the intrinsic color of the coloring material used within processing by a desilvering step.

Yet another object is to provide silver halide sensor type light-sensitive material capable of producing printing plates having good inking property or good printing durability.

The present inventors have found that it is possible to aid in eliminating the above described disadvantages by providing a photosensitive silver halide photographic emulsion and a nongaseous ethylenically unsaturated compound in different layers, respectively, so as to be adjacent each other. With this construction it is possible to obtain silver halide light-sensitive materials having the essential sensitivity of silver halide and high resolving power.

After the development processing, polymer images not containing reduction silver are obtained, if the unexposed parts are dissolved and the silver halide photographic emulsion layer is removed at the same time. Visible images having the intrinsic color of the coloring material are obtained, if it is dyed or the coloring material is previously incorporated. Further, a hydrophilic binder need not be used for the polymerizing layer, and polymer images having an excellent inking property and printing durability can be obtained as printing plates.

In silver halide sensor type polymerizable light-sensitive materials in which a nongaseous ethylenically unsaturated compound is polymerized on only latent image parts in the presence of silver halide having a photographic latent image, the present invention can be attained by providing a photosensitive silver halide photographic emulsion and a nongaseous ethylenically unsaturated compound capable of addition polymerization in different layers, respectively, so as to be adjacent each other. Any of the polymerizing layer and the silver halide layer may be disposed on the base side, but it is preferable that the polymerizing layer is disposed on the base side.

DETAILED DESCRIPTION OF THE INVENTION

In silver halide sensor type polymerizable light-sensitive materials, it is believed that the polymerization reaction is initiated by an oxidized radical of a reducing agent which reduces the silver halide. Accordingly, considering the instability of radicals, it is surprising that oxidized radicals formed in the silver halide photographic emulsion layer diffuse into another layer to initiate polymerization as in the present invention.

Further, in polymerizable light-sensitive materials, the polymerization initiator is generally present in the same layer as that of the nongaseous ethylenically unsaturated compound, by which polymerization is initiated. Accordingly, it is surprising that active seeds formed in another layer cause polymerization of the other layer by diffusion as in the present invention.

The photographic latent image means an image-like change formed on the silver halide photographic emulsion by electromagnetic waves or corpuscle rays, which is not generally visible but becomes a visible image after development. In conventional emulsions which form a negative picture, latent images are formed by the formation of development nuclei in silver halide particles irradiated with electromagnetic waves or corpuscle rays. In direct positive emulsion, development nuclei present in the all particles disappear by irradiation, by which latent images are formed (refer to James and Huggins, *Fundamentals of Photographic Theory*, 2nd Edition, chapters 3 and 4, issued by Morgan & Morgan Co., 1960).

Examples of silver halide photographic emulsions which can be used in the present invention include not only conventional silver halide photographic emulsions wherein development nuclei are formed on the exposed parts by the function of electromagnetic waves or corpuscle rays (namely, a negative picture is formed by development), but also the so-called direct positive emulsions wherein a larger amount of silver halide particles have development nuclei in unexposed parts than in parts subjected to image-like exposure.

Silver halide photographic emulsions which form a negative picture when subjected to conventional development processing can be advantageously used with the present invention. More specifically, it is possible to use silver chloride, silver bromide, silver chlorobromide, silver iodobromide and silver chloroiodobromide photographic emulsions. Photographic emulsions used in the present invention may be subjected to chemical sensitization or spectral sensitization used for conventional photographic emulsions. More specifically, it is possible to carry out sulfur sensitization, noble metal sensitization or reduction sensitization. (Refer to, for example, P. Glafkides, *Chimie Photographique*, 2nd Edition, pages 247–301, Photocinema, Paul Montel, Paris, 1957), and to *The Theory of the Photographic Process*, 4th Edition, chapter 5, issued by Macmillan Co., 1977. Further, for spectral sensitization, it is effective to use spectrally sensitizing dyes used for conventional photographic processes such as cyanine dyes or merocyanine dyes (refer to, for example, Shinichi Kikuchi, et al., *Shashin Binran*, Vol. 2, pages 15–24, issued by Maruzen Co., 1959). The emulsions used in the present invention may contain stabilizers utilized for conventional photographic processes.

Direct positive silver halide photographic emulsions capable of being used in the present invention can be produced by utilizing solarization, Herschel effect, Clayden effect or Sabattier effects. These effects have been described in, for example, C. E. K. Mees, *The Theory of the Photographic Process*, 2nd Edition, chapters 6 and 7 (issued by Macmillan Co., 1954). In order to produce a direct positive image in a silver halide emulsion layer with utilizing solarization, silver halide photographic emulsion layer of a type of easily undergoing solarization is produced and the whole surface thereof is preliminarily uniformly exposed to light or processed with a chemical agent so as to be capable of development without image-like exposure. Examples of production of such emulsions have been described in British Pat. Nos. 443,245 and 462,730.

The Herschel effect is caused by applying rays having long wavelengths to silver halide which becomes developable by subjecting to whole face exposure or by a chemical agent. In this case, silver halide emulsions containing a large amount of silver chloride are advantageously used. Further, desensitizing dyes such as pinakriptol yellow or phenosafranine, etc., may be added in order to promote the Herschel effect. Processes for producing direct positive emulsions utilizing the Herschel effect have been described in, for example, British Pat. No. 667,206 and U.S. Pat. No. 2,857,273.

In order to obtain a positive picture directly utilizing the Clayden effect, it is necessary to expose the whole surface at a comparatively low illuminance after carrying out image-like exposure for a short time at a high illuminance, by which parts which are not subjected to image-like exposure at a high illuminance become developable.

The Sabattier effect is caused when silver halide emulsions after being imagewise exposed are subjected to whole face exposure or a function of chemicals in a state of immersing in a developing solution, by which the parts which are not subjected to image-like exposure become developable. The Clayden effect and the Sabattier effect can be easily and practically created using silver halide emulsions which have more tendency toward forming development nuclei in the inner part of silver halide particles by previous exposure than on the surface of the particles.

Processes for producing such emulsions which easily form inner development nuclei have been described in, for example, U.S. Pat. Nos. 2,592,250 and 2,497,876, British Pat. No. 1,011,062 and German Pat. No. 1,207,791, etc.

Positive pictures can be formed using core-shell emulsions. Processes for producing core-shell emulsions have been described in U.S. Pat. Nos. 3,761,276 and 3,206,313.

In the present invention, gelatin may be used as a binder in the silver halide photographic emulsion layer, but other hydrophilic colloids can be used. For example, it is possible to use proteins such as gelatin derivatives, graft polymers of gelatin with other high polymers, albumin or casein, etc.; saccharose derivatives such as cellulose derivatives such as hydroxyethyl cellulose, carboxymethyl cellulose or cellulose sulfate, etc., sodium alginate or starch derivatives, etc.; and various synthetic hydrophilic polymeric substances such as homopolymers or copolymers such as polyvinyl alcohol, polyvinyl alcohol partial acetal, poly-N-vinylpyrrolidone, polyacrylic acid, polymethacrylic acid (substances formed by esterifying polyacrylic acid or polymethacrylic acid with glycidyl acrylate or glycidyl methacrylate), polyacrylamide, polyvinyl imidazole or polyvinyl pyrazole, etc.

Lime-treated gelatin as well as acid-treated gelatin may be used. Hydrolyzed products of gelatin and enzymatic decomposition products of gelatin can also be used. Useful gelatin derivatives include those prepared by reacting gelatin with various compounds such as acid halide, acid anhydrides, isocyanates, bromoacetic acid, alkanesultones, vinyl sulfonamides, maleinimides, polyalkylene oxides or epoxy compounds. Examples of them have been described in U.S. Pat. Nos. 2,614,928, 3,132,945, 3,186,846 and 3,312,553, British Pat. Nos. 861,414, 1,033,189 and 1,005,785 and Japanese Patent Publication No. 26845/67, etc.

Useful gelatin graft polymers include those prepared by grafting homopolymers or copolymers of vinyl monomers such as acrylic acid, methacrylic acid, derivatives of them such as esters or amides of them, acrylonitrile or styrene, etc., on gelatin. It is particularly preferred to use graft polymers prepared by grafting a polymer having some degree of compatibility with gelatin such as a polymer of acrylic acid, methacrylic acid, acrylamide, methacrylamide or hydroxyalkyl methacrylate, etc., on gelatin. Examples of them have been described in U.S. Pat. Nos. 2,763,625, 2,831,767 and 2,956,884, etc. Typical synthetic hydrophilic polymeric substances include those described in, for example, German Patent Application (OLS) No. 2,312,708, U.S. Pat. Nos. 3,620,751 and 3,879,205 and Japanese Patent Publication No. 7561/68.

It is preferred that the amount of silver halide to be coated is from 0.01 g/m$^2$ to 5 g/m$^2$, particularly from 0.05 g/m$^2$ to 1 g/m$^2$.

Light-sensitive materials of the present invention may contain inorganic or organic hardening agents and, further, may contain various known surface active agents as coating assistants or for purposes of preventing static charges, improvement of lubricating property, emulsification or preventing adhesion, etc.

Light-sensitive materials of the present invention may be provided with a protective layer and an antihalation layer similar to conventional silver halide light-sensitive materials.

Nongaseous ethylenically unsaturated compounds which can be used in the polymerizing layer of the present invention include compounds having at least one ethylenically unsaturated group capable of addition polymerization which are liquid or solid at room temperature or a mixture of them. Examples of such compounds include acrylamide, acrylonitrile, N-hydroxymethyl acrylamide, methacrylamide, N-t-butylacrylamide, methacrylic acid, acrylic acid, calcium acrylate, sodium acrylate, methacrylamide, methyl methacrylate, methyl acrylate, ethyl acrylate, 2-acrylamide-2-methylpropanesulfonic acid, vinyl pyrrolidone, 2-vinylpyridine, 4-vinylpyridine, 2-methyl-N-vinylimidazole, potassium vinylbenzenesulfonate and vinylcarbazole, etc. In the present invention, compounds having two or more ethylenically unsaturated groups are particularly advantageous. Such compounds may be used together with the above described compounds having one ethylenically unsaturated group. Such compounds having a plurality of ethylenically unsaturated groups may be used alone or may be used as a mixture of two or more thereof. Particularly preferred examples of such compounds include N,N'-methylenebisacrylamide, ethylene glycol dimethacrylate, diethylene glycol dimethacrylate, triethylene glycol dimethacrylate, polyethylene glycol dimethacrylate, divinyl ether, divinylbenzene, bisphenol A dimethacrylate, trimethylolpropane triacrylate, pentaerythritol tetraacrylate, bisoxyethylenated bisphenol A diacrylate and dipentaerythritol hexaacrylate, etc.

In the present invention, water-soluble ethylenically unsaturated compounds may be used. Further, it is possible to carry out polymerization by adding water-insoluble ethylenically unsaturated compound as an emulsion or by dissolving in a suitable solvent. Emulsification can be carried out according to the conventional method by means of a suitable stirring apparatus in the presence of surface active agents and/or polymeric compounds.

In the present invention, coloring agents may be added to the polymerizing layer. Useful coloring agents include pigments such as metal oxides, for example, titanium oxide, zinc oxide or iron oxide, etc., carbon black, phthalocyanine pigments or azo pigments, etc., and dyes such as xanthene dyes, for example, rhodamine, etc., triphenylmethane dyes, for example, Crystal Violet, etc., thiazine dyes, for example, Methylene Blue, etc., azo dyes, anthraquinone dyes, phthalocyanine dyes or naphthoquinone dyes, etc. The dyes or the pigments can be added according to the conventional methods such as dissolution, emulsification or dispersion.

In the present invention the binder for the polymerization layer may be a natural polymeric or synthetic polymeric substances which are soluble in water or an alkaline aqueous solution or at least capable of swelling. Examples of such natural polymeric substances include gelatins such as gelatin, gelatin derivatives or gelatin graft polymers, etc., polysaccharides such as starch or dextran, etc., cellulose derivatives and shellac, etc., similarly to the binder for silver halide emulsions. Examples of synthetic polymeric substances include homo- or copolymers of acrylic acid or methacrylic acid, free carboxylic acid group containing polymers such as polymers of maleic acid, itaconic acid or vinylbenzoic acid, etc., sulfonic acid group containing polymers such as sodium styrenesulfonate copolymers, etc., carboxylic acid anhydride group containing polymers such as itaconic acid anhydride copolymers, etc., novolak resins such as phenol-formaldehyde resin or cresol-formaldehyde resin, etc., hydroxy group containing polymers such as polyhydroxystyrene, polyvinyl alcohol or vinyl alcohol copolymers, etc., amide group containing polymers such as polyacrylamide or acrylamide copolymers, etc., sulfonamide group containing polymers such as styrenesulfonamide copolymers, etc., polyvinyl pyrrolidone, vinylpyrrolidone copolymers, copolymerized nylon, alcohol-soluble nylons such as methoxymethylated nylon, etc., and polyalkylene glycol, etc. These compounds can be used as a mixture of two or more of them.

Plasticizers may be added to the polymerizing layer. Examples of plasticizers include phthalic acid esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butyl benzyl phthalate, diisodecyl phthalate or diallyl phthalate, etc., glycol esters such as dimethyl glycol phthalate, ethylphthalyl ethyl glycol, methylphthalyl ethyl glycol, butylphthalyl butyl glycol or triethylene glycol dicaprylate, etc., phosphoric acid esters such as tricresyl phosphate or triphenyl phosphate, etc., aliphatic dibasic acid esters such as diisobutyl adipate, dioctyl adipate, dimethyl sebacate, dibutyl sebacate or diisooctyl azelate, etc., triethyl citrate, glycerol triacetyl ester and butyl laurylate, etc.

Various known surface active agents may be added to the polymerizing layer for the purpose of improving a coating property.

It is preferred that the amount of nongaseous ethylenically unsaturated compounds to be used is from 1 to 1,000 times, and particularly from 5 to 100 times the molar amount of the silver halide, or in other words, is from 0.2 to 10 times and particularly from 0.3 to 3 times the weight of the binder for the polymerizing layer.

In the photographic light-sensitive materials in the present invention, the polymerizing layer containing nongaseous ethylenically unsaturated compounds, the silver halide photographic emulsion layer and other layers are formed by applying to flexible supports conventionally used for photographic light-sensitive materials, such as plastic films, paper or cloth, etc., or rigid supports such as glass, ceramics or metal, etc. Useful flexible supports include films composed of semisynthetic or synthetic polymeric substances such as cellulose nitrate, cellulose acetate, cellulose acetate butyrate, polystyrene, polyvinyl chloride, polyethylene terephthalate or polycarbonate, etc., and coated or laminated papers prepared by applying or laminating a baryta layer or α-olefin polymer (for example, polyethylene, polypropylene or ethylene-butene copolymer), etc. The supports may be colored with pigments or dyes. They may be blackened for the purpose of light shielding. The surface of these supports may be subjected to undercoating treatment in order to improve adhesion to the polymerizing layer, etc. The surface of the supports may be subjected to corona discharging, ultraviolet ray application or flame treatment, etc., before or after the undercoating treatment.

In the present invention, metals having a hydrophilic surface may be used as the supports. Suitable metals include aluminum (including aluminum alloys), zinc, iron and copper. These metals may be laminated on or applied by vapor deposition to paper or a plastic film to form compound supports, or they may be used as the support themselves. These supports are subjected to surface treatment or application of a hydrophilic layer in order to obtain a hydrophilic surface, if necessary.

Electromagnetic waves or corpuscle rays capable of being used to obtain photographic images in the present invention include all electromagnetic waves and corpuscle rays by which conventional photographic emulsions are sensitized. Namely, it is possible to apply visible rays, ultraviolet rays, infrared rays of less than 1.3μ, X-rays, gamma rays and corpuscle rays such as electron rays or alpha rays. It is possible to use conventional methods including various light sources such as a tungsten lamp, fluorescent lamp, a mercury lamp, a xenon arc lamp, a carbon arc lamp, a xenon flash lamp, a halogen lamp, a light-emitting diode, a cathode ray tube flying spot, a discharge tube such as a glow lamp and laser rays such as an argon laser. The exposing time generally ranges from 1/1,000 second to 50 seconds, but an exposure shorter than 1/1,000 second, for example, an exposure of $1/10^4$ to $1/10^6$ second by a xenon flash lamp or a cathode ray tube or laser rays or an exposure longer than 50 seconds may be used. If necessary, the spectral composition of light used for exposure can be controlled by a color filter.

When carrying out development (reduction reaction of silver halide and polymerization reaction of ethylenically unsaturated compounds) of the silver halide sensor type polymerizable light-sensitive materials of the present invention, polymerization initiators are used. The polymerization initiator may be contained in a coating film of the light-sensitive materials or may be contained in a developing solution. However, it is preferable if they are contained in the developing solution in order to attain the objects of the present invention. Further, the development may be carried out by immersing the light-sensitive materials in the developing solution or by merely heating the light-sensitive materials.

The polymerization initiators may be used alone or two or more of them may be used together.

In the present invention, as polymerization initiators, it is possible to use any substance described in the following patents, including resorcinol and derivatives thereof, naphthol and derivatives thereof, pyrazolone compounds, hydrazine compounds, catechol and derivatives thereof, p-phenylenediamine, m-phenylenediamine and alkylphenols. (Japanese Patent Publication No. 6581/71 and U.S. Pat. Nos. 3,697,275, 3,782,944, 3,756,818, 3,767,400, 3,782,943, 3,697,273, 3,687,667, 3,874,947, 3,756,820, 3,707,379, 3,790,378 and 3,746,542).

Further, phenol compounds represented by the following general formulae may be used.

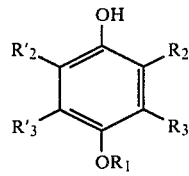

(I)

In the formula, $R_1$ represents an alkyl group or a substituted alkyl group, $R_2$ and $R'_2$ each represents hydrogen, an alkyl group, a substituted alkyl group, an aryl group, a substituted aryl group, an aralkyl group or a halogen atom, and $R_3$ and $R'_3$ each represents hydrogen, an alkyl group, a substituted alkyl group, an aryl group, a substituted aryl group, an aralkyl group, an alkoxy group, a thioalkyl group or a halogen atom.

(II)

(III)

(IV)

(V)

(VI)

In the formulae, A represents an oxygen atom or a sulfur atom, $R_{11}$ represents an alkyl group, a substituted alkyl group, an aryl group, a substituted aryl group or an aralkyl group, $R_{12}$ and $R'_{12}$ each represents hydrogen, an alkyl group, a substituted alkyl group, an alkoxy group, a thioalkyl group, an aryl group, a substituted aryl group or a halogen atom, $R_{13}$ represents an aryl group, a substituted aryl group or an aralkyl group, X represents

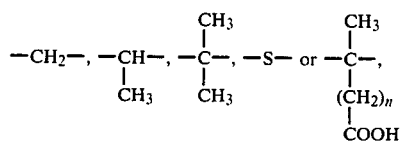

and n represents an integer of 1 to 4.

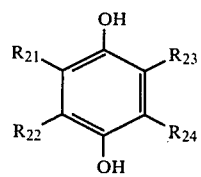  (VII)

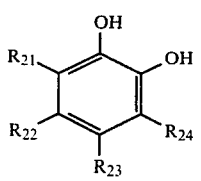  (VIII)

In the formulae, $R_{21}$, $R_{22}$, $R_{23}$ and $R_{24}$ each represents hydrogen, a halogen atom, an alkyl group, a substituted alkyl group, an aryl group, a substituted aryl group, an alkoxy group, a thioalkyl group or a cyano group, and at least one of $R_{21}$, $R_{22}$, $R_{23}$ and $R_{24}$ represents a halogen atom.

Of the formulae, preferred examples of the formulae include (I), (II), (IV) and (VI) and particularly preferred examples of the formulae include (I) and (II).

Examples of the phenol compounds include the following substances.

1. 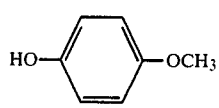

2. 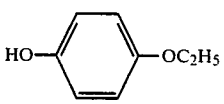

3. 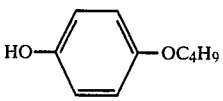

4. 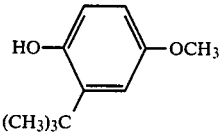

5. 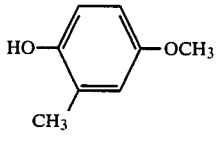

-continued

6. 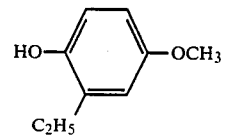

7. 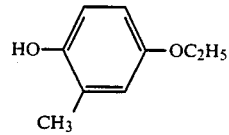

8. 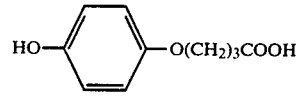

9. 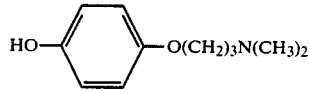

10. 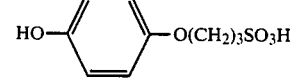

11. 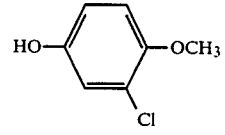

12. 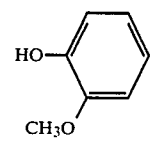

13. 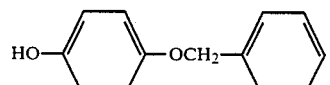

14. 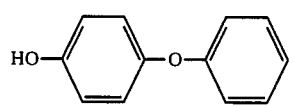

15. 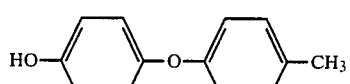

16. 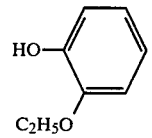

17. 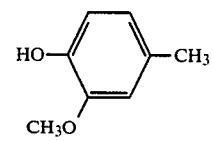

-continued
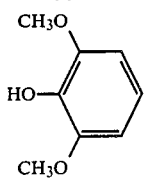 18.
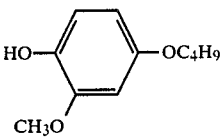 19.
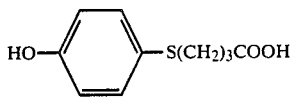 20.
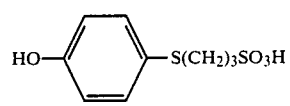 21.
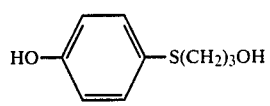 22.
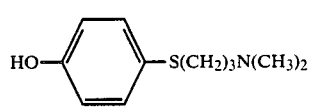 23.
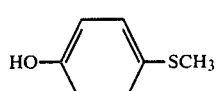 24.
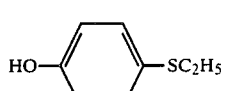 25.
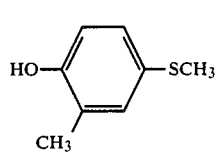 26.
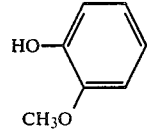 27.
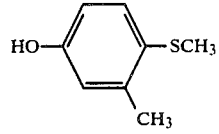 28.
-continued
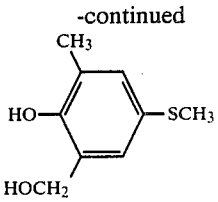 29.
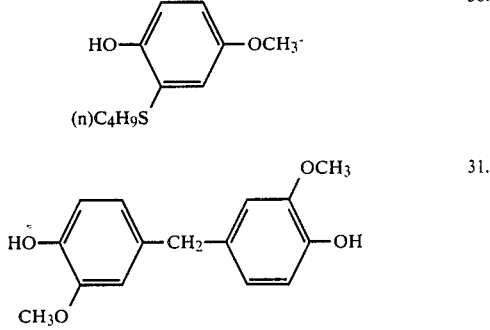 30.
31.
32.
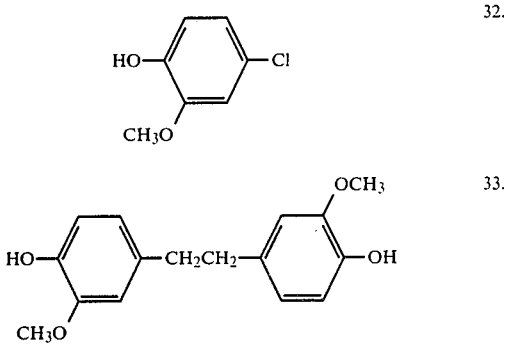 33.
34.
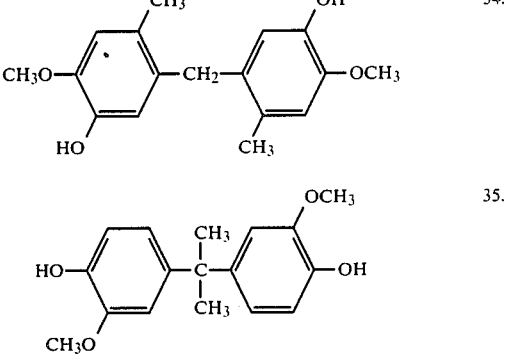 35.
36.
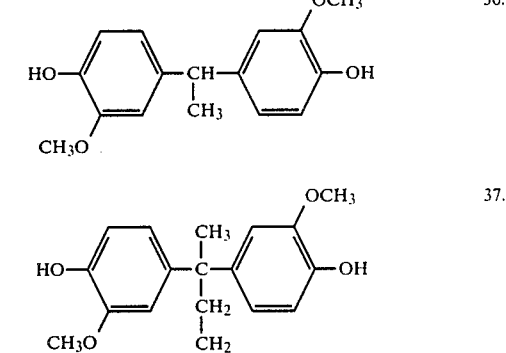 37.

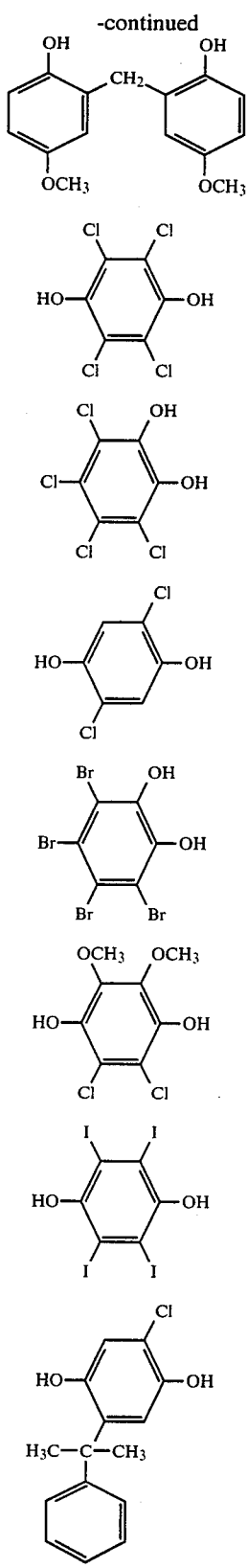

When incorporating the phenol compounds in the photographic light-sensitive material, it is preferred that the amount of phenol compounds to be used is from 0.001 to 1 time and particularly from 0.01 to 0.5 time the molar amount of nongaseous ethylenically unsaturated compound. On the other hand, when the phenol compounds are added to the processing solution, it is preferred that the phenol compounds are added in a range of from 1/1,000 mol to 5 mols, and particularly from 1/50 mol to 1 mol per liter of the solution.

Further, in the process of the present invention, if sulfurous acid ions are present in the system, polymerization of nongaseous ethylenically unsaturated compounds is accelerated.

Sulfurous acid ions may be formed by adding compounds having sulfurous acid ions such as alkali metal or ammonium sulfite or bisulfite or substances which disperse in an aqueous solution to form sulfurous acid ions such as addition products of alkali metal or ammonium pyrosulfite or bisulfite and aldehyde such as formaldehyde or glyoxal. A suitable amount of sulfurous acid ions varies according to the kind and amount of the phenol compound used and those of the nongaseous ethylenically unsaturated compounds and pH of the system, etc., but it is preferred to be 0.002 mol or more and preferably 0.01 mol or more per liter of the reaction system.

The function and mechanism of the sulfurous acid are not obvious, but it appears to prevent the function of interrupting polymerization by oxygen.

The polymerization reaction can be accelerated by using a small amount of a conventional photographic developing agent or by previously processing with the conventional developing agent.

Examples of such conventional photographic developing agents include compounds having a structure represented by $$A-(\overset{|}{C}=\overset{|}{C})_n-B$$

(wherein A and B each represents —OH, —NH$_2$ or —NHR and n represents an integer of 4 or less, wherein R represents a group selected from alkyl groups having 4 or less carbon atoms, hydroxyalkyl groups, alkoxyalkyl groups and alkylsulfonamidoalkyl groups or an aryl group), 1-aryl-3-oxopyrazolidines and 1-aryl-3-iminopyrazolidines. Although these conventional photographic developing agents do not cause polymerization themselves, they accelerate a developing function of the reducing agent having a function of initiating polymerization, whereby the polymerization reaction can be accelerated.

This reaction generally proceeds well under an alkaline state, but the most preferred pH depends upon kinds and amounts of silver halide, phenol compounds and medium polymeric compounds and reaction temperature. The reaction can be carried out at a pH of about 8 or more and a pH of 9 or more is particularly advantageous.

Stopping of the reaction is easily carried out by acidifying the system (for example, pH 5 or less), cooling, dissolution of silver halide by a photographic fixing solution, or addition to a system containing a polymerization inhibitor. However, the reaction can be stopped by immersing in a processing solution capable of dissolving the polymerizing layer (etching solution) to dissolve unpolymerized parts.

The light-sensitive materials of the present invention can be used as light-sensitive materials for phototype setting, light-sensitive materials for intermediate originals, materials for color proofs, films for plate making and printing plates, etc.

EXAMPLE 1

0.8 g of benzyl methacrylate-methacrylic acid copolymer (80:20), 0.8 g of pentaerythritol tetraacrylate and 0.01 g of p-methoxyphenol were dissolved in a mixture consisting of 14 g of methyl ethyl ketone, 14 g of ethylene glycol monomethyl ether acetate and 5 g of cyclohexanone. After 0.8 g of Microlis black CA (carbon) was added, the mixture was dispersed in a small-sized dispersing apparatus and applied to a polyethylene terephthalate film having a subbing layer to form a polymerizing layer having a thickness of 2μ.

Silver halide composed of 75% by mol of silver chloride, 24.5% by mol of silver bromide and 0.5% by mol of silver iodide was processed using gelatin and then subjected to sulfur sensitization and gold sensitization by conventional methods. The average particle size of silver halide particles was 0.20 μm. A merocyanine dye having a sensitization maximum in 550 nm was added as a sensitizing dye, and about 0.5 g of tolylene 2,4-diisocyanate based on 100 g of gelatin was added as a hardening agent. Further, a suitable stabilizer and a suitable surface agent were added, and the resulting sensitizing solution was applied to the above described polymerizing layer so as to contain 0.2 g of silver and 2 g of gelatin based on 1 m² to produce a coating sample.

This sample was placed in contact with a step-wedge having a step difference of 0.15 (Δ log E) and exposed to white tungsten light (2,860° K.) of 200 luxes for 1 second. Then, it was immersed in the following developing solution under red safety light at 40° C. for 2 minutes.

| | |
|---|---|
| p-Methoxyphenol | 12 g |
| Sodium sulfite | 7 g |
| Sodium carbonate | 5 g |
| Potassium bromide | 0.1 g |
| β-Acetylphenylhydrazine | 0.3 g |
| pH was adjusted to 10.2 by sodium hydroxide. | |
| Water to make | 1 liter |

After the development, it was immersed in the following etching solution for 20 seconds.

| | |
|---|---|
| Ethylene glycol monobutyl ether | 30 g |
| Sodium dodecylbenzenesulfonate | 10 g |
| Sodium sulfite | 2 g |
| Sodium hydroxide | 6 g |
| Water to make | 1 liter |

It was sufficiently washed with water to dissolve the silver halide emulsion layer and the polymerizing layer on the unexposed part (unpolymerized part). Thus, a black polymer image was obtained.

EXAMPLE 2

Preparation and processing of the sample were carried out by the same procedures as in Example 1, except that a yellow dye: Zapon Fast Yellow 2RE was used instead of Microlis black CA. Thus, a yellow polymer image was obtained.

EXAMPLE 3

Preparation and processing of the sample were carried out by the same procedures as in Example 1, except that a polymerizing layer having a thickness of 3μ was obtained by dissolving 10 g of pentaerythritol tetraacrylate and 1 g of p-methoxyphenol in 10 g of ethyl acetate, adding 6 g of Microlis black CA (carbon) to disperse by a small-sized dispersing apparatus, adding the resulting dispersion to a solution prepared by dissolving 1.4 g of 85% vinylbenzenesulfonylated gelatin and 0.5 g of sodium dodecylbenzenesulfonate in 25 g of water, emulsifying with a high-speed emulsifying apparatus, and applying the resulting emulsion to a polyethylene terephthalate film having a subbing layer. The sample was developed and the silver halide emulsion layer and the unexposed part (unpolymerized part) were dissolved by spraying hot water at 50° C. Thus, a black polymer image was obtained.

EXAMPLE 4

Preparation and processing of the sample were carried out by the same procedures as in Example 1, except that a yellow dye: Zapon Fast Yellow 3RE was used instead of Microlis Black CA. Thus, a yellow polymer image was obtained.

EXAMPLE 5

0.8 g of alcohol-soluble nylon (Toray Amilan CM-8000), 0.8 g of dipentaerythritol hexaacrylate, 0.1 g of nitrocellulose, 0.01 g of p-methoxyphenol and 0.2 g of Zapon Fast Yellow 3RE were dissolved in a mixture of 20 g of methanol and 5 g of cyclohexanone. The solution was applied to a polyethylene terephthalate film which was subjected to glow discharge treatment to form a polymerizing layer having a thickness of 1.5μ.

To the above described polymerizing layer, the same sensitizing solution as in Example 1 was applied so as to contain 0.20 g of silver and 2 g of gelatin based on 1 m² to produce a coating sample.

The resulting sample was exposed to light and developed by the same procedure as in Example 1. Then, it was immersed in the following etching solution for 20 seconds.

| | |
|---|---|
| NaOH | 6 g |
| Sodium dodecylbenzenesulfonate | 12 g |
| Ethylene glycol monobutyl ether | 1 g |
| H₂O | 900 cc |

It was sufficiently washed with water to dissolve the silver halide emulsion layer and the polymerizing layer on the unexposed part (unpolymerized part). Thus, a yellow polymer image was obtained.

EXAMPLE 6

A coating sample was prepared by the same procedure as in Example 1 except that 2-ethylhexyl methacrylate-methacrylic acid copolymer (70:30) was used instead of benzyl methacrylate-methacrylic acid copolymer (80:20). It was exposed to light, developed and etched to obtain a black polymer image.

EXAMPLE 7

A 2S aluminum plate mechanically sanded was immersed in a 2% aqueous solution of sodium hydroxide kept at 40° C. for 1 minute to corrode a part of the surface. After washing with water, it was immersed in a sulfuric acid-chromic acid solution for about 1 minute to expose the pure aluminum surface. It was immersed in 20% sulfuric acid kept at 30° C., and anodic oxidation processing was carried out under a D.C. voltage of 1.5

V and a current density of 3 A/dm². Thereafter, it was washed with water and dried.

Then, a solution prepared by dissolving 0.8 g of alcohol-soluble nylon (Toray Amilan CM-8000), 0.8 g of dipentaerythritol hexaacrylate, 0.1 g of nitrocellulose, and 0.01 g of p-methoxyphenol in a mixture of 20 g of methanol and 5 g of cyclohexane was applied to the above described aluminum plate.

The thickness of the dried film was 2μ.

To the above described polymerizing layer, the same sensitizing solution as in Example 1 was applied so as to contain 0.20 g of silver and 2 g of gelatin based on 1 m² to produce a coating sample.

This sample was exposed to light by the same procedure as in Example 1, followed by developing and etching. It was sufficiently washed with water to dissolve the silver halide emulsion layer and the polymerizing layer on the unexposed part (unpolymerized part). Thus, a polymer image was obtained.

When the processed sample was set on a printer Hamada star 500CD and printing was carried out using an available damping water, 5,000 or more good prints were obtained.

While the invention has been described in detail and with reference to specific embodiments thereof, it will be apparent to one skilled in the art that various changes and modifications can be made therein without departing from the spirit and scope thereof.

What is claimed is:

1. A process for forming polymeric images comprising:
   providing a light-sensitive material comprising a support having thereon (a) a silver halide photographic emulsion layer, (b) a polymerizable layer adjacent said emulsion layer, said polymerizable layer containing a nongaseous ethylenically unsaturated compound capable of undergoing addition polymerization and a binder for the polymerizable layer, and (c) a reducing compound in said emulsion layer or said polymerizable layer, said reducing compound being a compound capable of reducing said silver halide and capable of initiating polymerization in said polymerizable layer upon reduction of the silver halide; and
   image-wise exposing the light-sensitive material to form latent image areas in the silver halide emulsion layer forming polymeric images in the polymerizable layer, in the areas of the polymerizable layer which correspond to the areas of the silver halide having the latent image areas by processing said light-sensitive material with a processing solution having a pH of 8 or more after image-wise exposure.

2. A process as claimed in claim 1, wherein the polymerizable layer contains the reducing compound.

3. A process as claimed in claim 1, wherein the reducing compound is a phenol compound.

4. A process as claimed in claim 3, wherein the phenol compound is represented by one of the following general formulae:

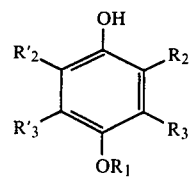

wherein $R_1$ represents an alkyl group or a substituted alkyl group, $R_2$ and $R'_2$ each represents hydrogen, an alkyl group, a substituted alkyl group, an aryl group, a substituted aryl group, an aralkyl group or a halogen atom, and $R_3$ and $R'_3$ each represents hydrogen, an alkyl group, a substituted alkyl group, an aryl group, a substituted aryl group, an aralkyl group, an alkoxy group, a thioalkyl group of a halogen atom;

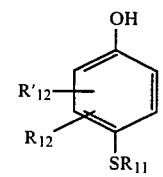

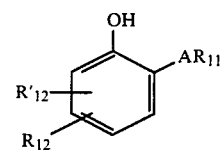

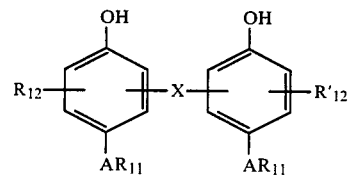

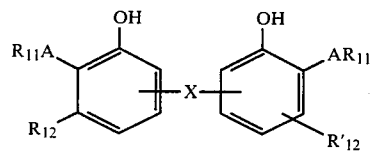

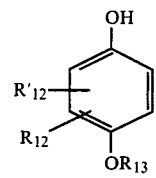

wherein in formulas (II) to (VI), A represents an oxygen atom or a sulfur atom, $R_{11}$ represents an alkyl group, a substituted alkyl group, an aryl group, a substituted aryl group or an aralkyl group, $R_{12}$ and $R'_{12}$ each represents hydrogen, an alkyl group, a substituted alkyl group, an alkoxy group, a thioalkyl group, an aryl group, a substituted aryl group or a halogen atom, $R_{13}$ represents an aryl group, a substituted aryl group or an aralkyl group, X represents

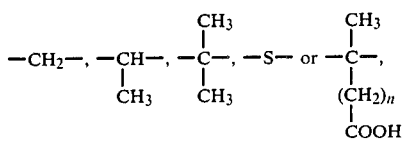

and n represents an integer of 1 to 4;

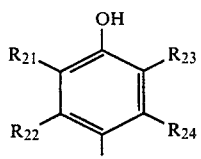 (VII)

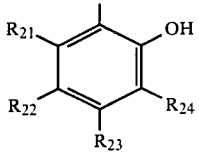 (VIII)

wherein in the formulas (VII) to (VIII), $R_{21}$, $R_{22}$, $R_{23}$ and $R_{24}$ each represents hydrogen, a halogen atom, an alkyl group, a substituted alkyl group, an aryl group, a substituted aryl group, an alkoxy group, a thioalkyl group or a cyano group, and at least one of $R_{21}$, $R_{22}$, $R_{23}$ and $R_{24}$ represents a halogen atom.

5. A process as claimed in claim 1, wherein the binder for the polymerizable layer is soluble in water or an alkaline aqueous solution.

6. A process as claimed in claim 1, wherein the amount of said nongaseous ethylenically unsaturated compound is from 0.2 to 10 times the weight of the binder for the polymerizable layer.

7. A process as claimed in claim 1, wherein the amount of said reducing compound is from 0.001 to 1 times the molar amount of said nongaseous ethylenically unsaturated compound.

8. A process as claimed in claim 1, wherein the processing solution contains sulfurous acid ion in an amount effective to accelerate the polymerization of the nongaseous ethylenically unsaturated compound.

9. Process as defined in claim 1, wherein the silver halide emulsion is a direct positive emulsion in which development nuclei are initially present in all particles and in which the development nuclei disappear by irradiation.

10. Process as claimed in claim 9, wherein the reducing compound is in the polymerizable layer.

11. A process forming polymeric images comprising:
providing a light-sensitive material comprising a support having thereon a silver halide photographic emulsion layer and a polymerizable layer adjacent said emulsion layer, wherein said polymerizable layer comprises a nongaseous ethylenically unsaturated compound capable of undergoing addition polymerization and a binder for the polymerizable layer;
image-wise exposing the light-sensitive material to form latent image areas in the silver halide emulsion layer; and
forming polymeric images in the polymerizable layer, in the areas of the polymerizable layer which correspond to the areas of the silver halide having the latent image areas by processing said light-sensitive material with a processing solution containing a reducing compound and having a pH of 8 or more after image exposure, wherein said reducing compound is a compound capable of reducing said silver halide and capable of initiating polymerization in said polymerizable layer upon reduction of the silver halide.

12. A process as claimed in claim 11, wherein the reducing compound is represented by one of the following general formulae:

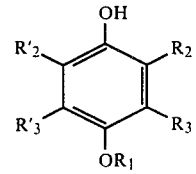 (I)

wherein $R_1$ represents an alkyl group or a substituted alkyl group, $R_2$ and $R'_2$ each represents hydrogen, an alkyl group, a substituted alkyl group, an aryl group, a substituted aryl group, an aralkyl group or a halogen atom, and $R_3$ and $R'_3$ each represents hydrogen, an alkyl group, a substituted alkyl group, an aryl group, a substituted aryl group, an aralkyl group, an alkoxy group, a thioalkyl group of a halogen atom;

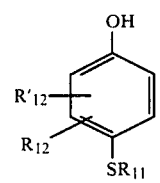 (II)

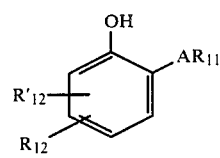 (III)

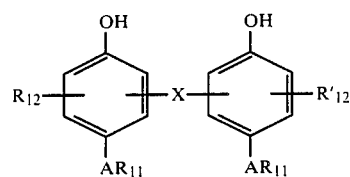 (IV)

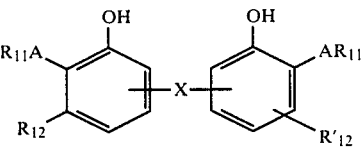 (V)

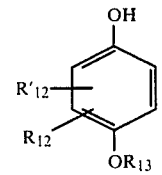 (VI)

wherein in formulas (II) to (VI), A represents an oxygen atom or a sulfur atom, $R_{11}$ represents an alkyl group, a substituted alkyl group, an aryl group, a substituted aryl group or an aralkyl group, $R_{12}$ and $R'_{12}$ each represents hydrogen, an alkyl group, a substituted alkyl group, an alkoxy group, a thioalkyl group, an aryl group, a substituted aryl group or a halogen atom, $R_{13}$ represents an aryl group, a substituted aryl group or an aralkyl group, X represents

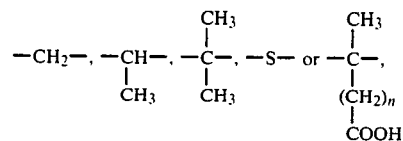

and n represents an integer of 1 to 4;

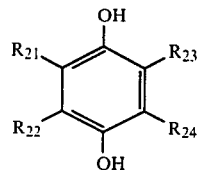 (VII)

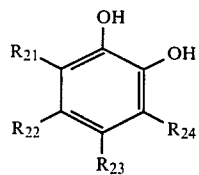 (VIII)

wherein in the formulas (VII) to (VIII), $R_{21}$, $R_{22}$, $R_{23}$ and $R_{24}$ each represents hydrogen, a halogen atom, an alkyl group, a substituted alkyl group, an aryl group, a substituted aryl group, an alkoxy group, a thioalkyl group or a cyano group, and at least one of $R_{21}$, $R_{22}$, $R_{23}$ and $R_{24}$ represents a halogen atom.

13. A process as claimed in claim 11, wherein the binder for the polymerizable layer is soluble in water or an alkaline aqueous solution.

14. A process as claimed in claim 11, wherein the amount of said reducing compound is from 1/1,000 to 5 mol per liter of the processing solution.

15. A process as claimed in claim 11, wherein the amount of said nongaseous ethylenically unsaturated compound is from 0.2 to 10 times the weight of the binder for the polymerizable layer.

16. A process as claimed in claim 11, wherein the processing solution contains sulfurous acid ion in an amount effective to accelerate the polymerization of the nongaseous ethylenically unsaturated compound.

17. Process as defined in claim 11, wherein the silver halide emulsion is a direct positive emulsion in which development nuclei are initially present in all particles and in which the development nuclei disappear by irradiation.

18. A process for forming polymeric images in areas having development nuclei in a light-sensitive material after exposure, comprising:
providing a light-sensitive material comprising a support, a silver halide photographic emulsion layer, and a polymerizable layer adjacent said emulsion layer, said polymerizable layer containing a nongaseous ethylenically unsaturated compound capable of undergoing addition polymerization upon reduction of the silver halide with a reducing compound;
forming areas in the silver halide emulsion layer which have greater development nuclei than other areas of the silver halide emulsion layer by imagewise exposure of the light-sensitive material;
developing the silver halide emulsion layer in the presence of at least one reducing compound to reduce the silver halide in the areas having greater development nuclei and
forming polymeric images in the polymerizable layer, in the areas of the polymerizable layer which corresponds to the areas of the silver halide having a greater development nuclei, upon reduction of the silver halide with said reducing compound.

19. Process as defined in claim 18, wherein the silver halide emulsion is a direct positive emulsion in which development nuclei are initially present in all particles and in which the development nuclei disappear by irradiation.

* * * * *